United States Patent [19]

Hiraiwa et al.

[11] Patent Number: 4,989,056
[45] Date of Patent: Jan. 29, 1991

[54] SEMICONDUCTOR CAPACITOR

[75] Inventors: Atsushi Hiraiwa, Kodaira; Shinpei Iijima, Akishima; Jiro Yugami, Tokyo, all of Japan

[73] Assignee: Hitachi, Ltd., Tokyo, Japan

[21] Appl. No.: 349,820

[22] Filed: May 10, 1989

[30] Foreign Application Priority Data

May 16, 1988 [JP] Japan ................................ 63-117140

[51] Int. Cl.$^5$ ..................... H01L 29/68; H01L 27/02; H01L 27/01
[52] U.S. Cl. ..................................... 357/23.6; 357/51; 357/23.1
[58] Field of Search ........................ 357/23.6, 51, 23.1

[56] References Cited

U.S. PATENT DOCUMENTS 4,432,006  2/1984  Takei .................................. 357/23.6
4,649,406  3/1987  Takemae et al. .................. 357/23.6

OTHER PUBLICATIONS

Hu, Chenming "Thin Oxide Reliability" IEDM 85, Dec. 1985, pp. 368-371.

*Primary Examiner*—Rolf Hille
*Assistant Examiner*—Robert P. Limanek
*Attorney, Agent, or Firm*—Antonelli, Terry, Stout & Kraus

[57] ABSTRACT

A capacitor having a first electrode, a thin insulator formed on said first electrode and a second electrode formed on said insulator wherein said first and second electrodes are composed of semiconductors that are of complementary conductivity type. Therefore, the current that flows through the capacitor insulator is efficiently suppressed while the thickness of the insulator is decreased, making it possible to realize a capacitor of a small area yet having a large capacitance.

23 Claims, 6 Drawing Sheets

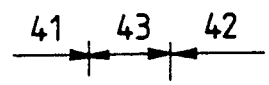 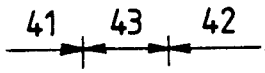 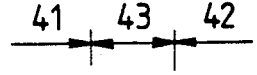
FIG. 2(a)    FIG. 2(b)    FIG. 2(c)
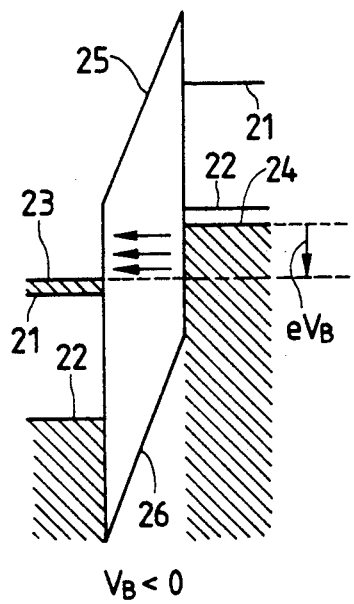 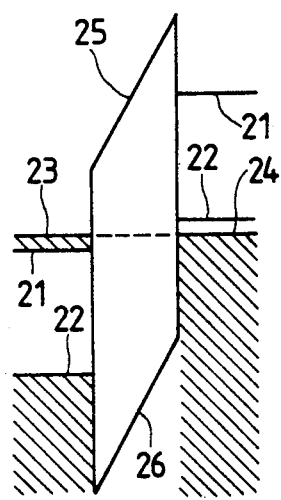 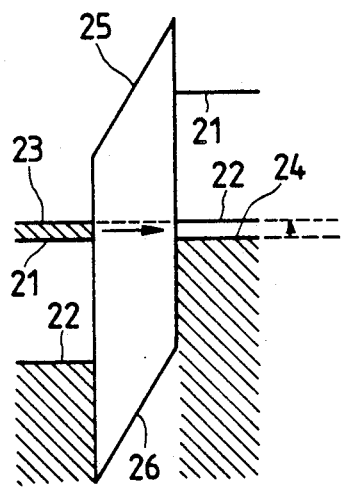
$V_B < 0$    $V_B = 0$    $V_B > 0$
FIG. 2(d)    FIG. 2(e)    FIG. 2(f)
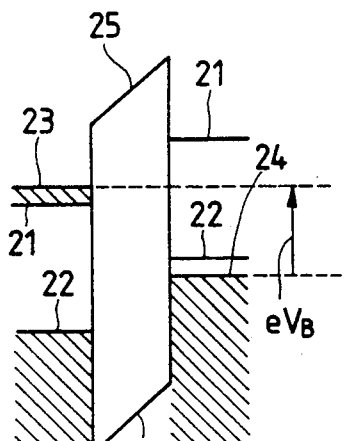 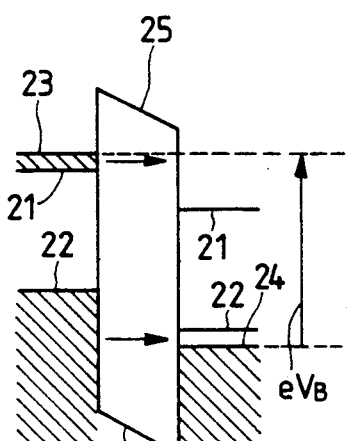 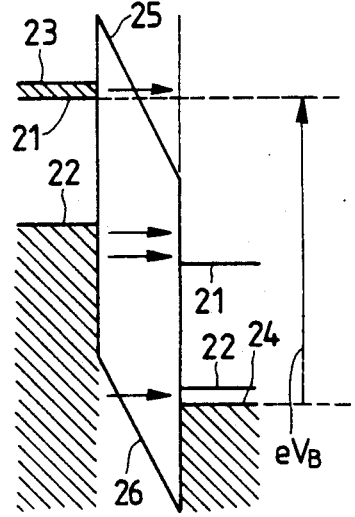
$V_B > 0$    $V_B > 0$    $V_B > 0$

SEMICONDUCTOR CAPACITOR

BACKGROUND OF THE INVENTION

The present invention relates to a semiconductor device, and more specifically to a capacitor and to a semiconductor device equipped with a capacitor.

Dynamic random, access memories (hereinafter referred to as DRAMs) have been realized in ever highly densely integrated form at a striking rate at all times. The main stream at the present time is constituted by 256-kilobit DRAMs. However mass production of 1-megabit DRAMs has been started already. The trend toward such high integration degrees is made possible chiefly by the reduction of dimensions of devices. Accompanying the reduction in the dimensions, however, the capacitor area decreases and the capacitance of a storage capacitor of the memory decreases causing the signal-to-noise ratio (S/N ratio) to decrease and giving rise to the occurrence of signal reversal (so-called soft error) due to α-rays, imposing a serious problem from the standpoint of reliability. Therefore, it has heretofore been attempted to reduce the thickness of the capacitor insulator in order to prevent the reduction of capacitance that stems from the decrease in the dimensions. In the case of the 1-megabit DRAM, the thickness is 10 nm in terms of silicon dioxide equivalent. In the case of the 4-megabit DRAM of the next generation, it is considered that the thickness of the insulator must be reduced to 4 to 6 nm. The thickness of the capacitor insulator in terms of silicon dioxide equivalent is that of a silicon dioxide film formed by thermal oxidation composing the capacitor with the same capacitance, and is expressed by the following formula, i.e., $$d = \frac{S\epsilon}{C}$$

where C denotes a measured capacitance S denotes an area, $\epsilon$ denotes a dielectric constant of $SiO_2$ formed by the thermal oxidation, and d denotes a thickness of the film converted into the silicon dioxide film.

As the thickness of the insulator becomes so small, however, a tunnel current flows through the insulator of the capacitor and the stored charge is lost. This fact has been discussed for example, in Solid-State Electronics, Vol. 10, 1967, pp. 865–873.

One of means for solving this problem is represented by a capacitor called tacked capacitor in which electrodes and an insulator are stacked on the gate of a drive MOS transistor and on a thick insulator for device isolation. The stacked capacitor has been disclosed, for example, in Japanese Patent Publication No. 55258/1986. In the stacked capacitor as described above, a portion thereof is formed so as in to be stacked on the MOS transistor or on the insulator for device isolation enabling the capacitor area to be increased. Therefore, even when an insulator is used having a thickness of 10 nm in terms of silicon dioxide equivalent, it becomes possible to maintain a capacitance required for the 4-megabit DRAM. Namely, the problem of extinction of the stored charge is solved.

With the above-mentioned prior art, however, it is no longer possible to further increase the degree of integration. In order to realize, for instance, a 16-megabit dynamic random access memory (DRAM), the thickness of the capacitor insulator must be further decreased. As the thickness of the insulator is decreased to about 5 nm in terms of silicon dioxide equivalent, however, the problem arises again, i.e., the stored charge are lost because of the resulting tunnel current. It has been reported also that the insulator 5 nm thick barely meets the needs for practical application. However, it becomes quite difficult to further decrease the thickness. When the DRAM is integrated to an even higher degree, furthermore, the throughput may decrease due to variation in the thickness of the capacitor insulator; i.e., it is virtually impossible to further increase the degree of integration.

SUMMARY OF THE INVENTION

It is an object of the present invention to provide a capacitor with a small area and a large capacitance, and to provide a semiconductor device having such a capacitor.

Another object of the present invention is to provide a semiconductor memory device which is highly densely integrated.

A further object of the present invention is, to provide a capacitor which has an insulator not only of a reduced thickness but which prevents the flow of tunnel current and prevents the extinction of any charge stored therein and to provide a semiconductor device having such a capacitor.

In order to achieve the above-mentioned objects, he present invention deals with a semiconductor device having a capacitor which comprises a semiconductor substrate or a first electrically conductive thin film, an insulator formed on the semiconductor substrate or on the first electrically conductive thin film, and a second electrically conductive thin film formed on the insulator, wherein the semiconductor substrate or the first electrically conductive film has a conduction type different from the conduction type of the second electrically conductive thin film.

According to the present invention, surfaces of the upper electrode and the lower electrode of the capacitor, i.e., surfaces of the semiconductor substrate or the first electrically conductive thin film under the insulator and of the second electrically conductive thin film over the insulator of at least the side contacting to the insulator should contain dopants at a concentration of $1 \times 10^{19}$ cm$^{-3}$ or higher. When the dopant concentration is smaller than $1 \times 10^{19}$ cm$^{-3}$, a depletion layer is formed in the electrode to substantially decrease the capacitance. When the dopant concentration is greater than $2 \times 10^{21}$ cm$^{-3}$, however, excess of dopants diffuse into the insulator to deteriorate its insulating property. According to the present invention, therefore, surfaces of the upper electrode and the lower electrode of at least the side contacting to the insulator should contain dopants at a concentration over a range of from $1 \times 10^{19}$ cm$^{-3}$ to $2 \times 10^{21}$ cm$^{-3}$.

BRIEF DESCRIPTION OF THE DRAWINGS

FIGS. 2(a) to 2(f) and FIGS. 3(a) to 3(d) are band diagrams for explaining the principle of the present invention;

DETAILED DESCRIPTION OF THE PREFERRED EMBODIMENTS

As the thickness of the insulator decreases, a tunnel current starts to flow through the capacitor insulator as described earlier. Its mechanism has been discussed in, for example, Physical Review Vol. 140, 1965, pp. 179–186. According to this theory, the following conditions must be realized for the tunnel current to flow. (1) The electrons should tunnel from one electrode through to the other electrode at a large probability (2) The electrode to which the electrons will tunnel through should have a quantum state that has the same energy as the electrons that exist on the electrode from which the tunnelling is started and that is not occupied by the electrons.

In the conventional capacitor which satisfies the above condition (2), the condition (1) is automatically realized as the insulator is made thinner, and a tunnel current flows. According to the present invention, on the other hand, contrivance is made to the materials of the electrodes to prevent the above-mentioned condition (2) from being realized and to decrease the flow of tunnel current. The invention will be described in further detail in conjunction with FIGS. 1 and 2. To simplify the description, it is presumed that the temperature is at the absolute zero point. A bias voltage is applied to the electrode consisting of a p-type semiconductor of the right side with the electrode consisting of an n-type semiconductor of the left side as a reference.

Figure 1:
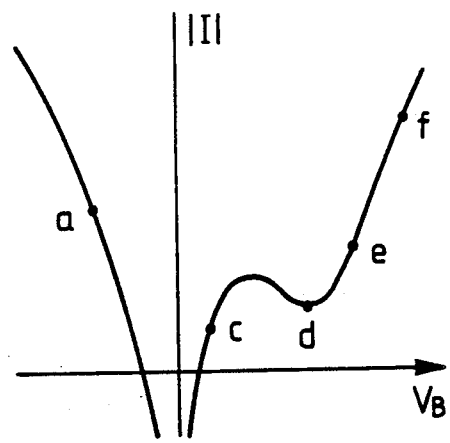
FIG. 1 is a diagram showing current-voltage characteristics of a capacitor according to the present invention.

FIG. 1 shows a relationship between the bias voltage $V_B$ in the capacitor of the present invention and the current (gate current) I that flows through the capacitor. That is, as a negative bias voltage is applied, a gate current abruptly increases. As a positive bias voltage is applied, on the other hand, the gate current increases at first but once decreases (negative resistance) and then increases again. This phenomenon will now be described with reference to FIG. 2.

When the bias voltage $V_B$ is 0 V as shown in FIG. 2(b), the Fermi level 23 of an n-type semiconductor 41 which is the electrode of the left side becomes in agreement with the Fermi level 24 of a p-type semiconductor 42 which is the electrode of the right side. In the n-type semiconductor 41, the bottom 21 of a conduction band is positioned below the Fermi level 23, and the top 22 of a valence band is positioned therebelow.

In the p-type semiconductor 42, on the other hand, a top 22 of a valence band is positioned above the Fermi level 24, and a bottom 21 of the conduction band is positioned thereabove.

The bottom 25 of conduction band of an insulator 43 sandwiched between the n-type semiconductor 41 and the p-type semiconductor 42 is positioned to be higher than the Fermi level, and the top 26 of valence band of the insulator 43 is positioned to be lower than the Fermi level. In this case, the aforementioned condition (2) is not realized.

When a negative bias voltage is applied as shown in FIG. 2(a), the Fermi level 24 of the p-type semiconductor 42 becomes higher than the Fermi level 23 of the n-type semiconductor 41, and the electrons in the valence band of the p-type semiconductor 42 tunnel through into the conduction band of the n-type semiconductor 41 (condition represented by point a in FIG. 1). As the absolute value of bias voltage increases, the tunnel current increases with the increase in the number of electrons which can tunnel through.

When a positive bias voltage is applied as shown in FIG. 2(c), on the other hand, the Fermi level 23 of the n-type semiconductor 41 becomes in conformity with the top of valence band of the p-type semiconductor 42. In this case, the electrons in the conduction band of the n-type semiconductor 41 tunnel through to the valence band of the p-type semiconductor 42, and a current flows (condition represented by a point c in FIG. 1). As the bias voltage is increased as shown in FIG. 2(d), however, there no longer exists in the p-type semiconductor 42 the quantum state that has the same energy as the electrons in the conduction band of the n-type semiconductor 41, and the tunnel current decreases (condition represented by a point d in FIG. 1). As the bias voltage is further increased as shown in FIG. 2(e), electrons in the conduction band and electrons in the valence band of the n-type semiconductor 41 tunnel through to the conduction band and valence band of the p-type semiconductor 42, and the tunnel current increases again (condition represented by a point e in FIG. 1). FIG. 2(f) shows the case where the bias voltage is further increased. The electrons in the valence band of the n-type semiconductor 41 include those electrons that tunnel through to the conduction band of the p-type semiconductor 42, and the tunnel current further increases (condition represented by a point f in FIG. 1).

The fundamental principle of the present invention is to realize the condition shown in (FIG. 2(d) in order to decrease the tunnel current. In practice, however, an interface state or an impurity state is formed in the forbidden band of the semiconductor or the insulator, and tunneling is often assisted by these states. Therefore, the negative resistance shown in FIG. 1 is not often exhibited. Even in this case, however, the current that flows through the capacitor is smaller than that of the prior art.

The present invention is effective for the cases where a positive bias is applied to the p-type semiconductor electrode with the n-type semiconductor electrode as a reference, but is not effective for the cases where negative biases are applied. The constitution might therefore be contrived to so combine the present invention as to suppress the tunnel current for the bias of both polarities. That is, the electrodes constituting the capacitor have the same type of conduction, a thin electrically conductive film having opposite type of conduction is formed between the two electrodes, and the structure of the present invention is realized between the electrically conductive thin film and the capacitor electrodes. The inventors therefore have studied this structure.

Figure 3A:
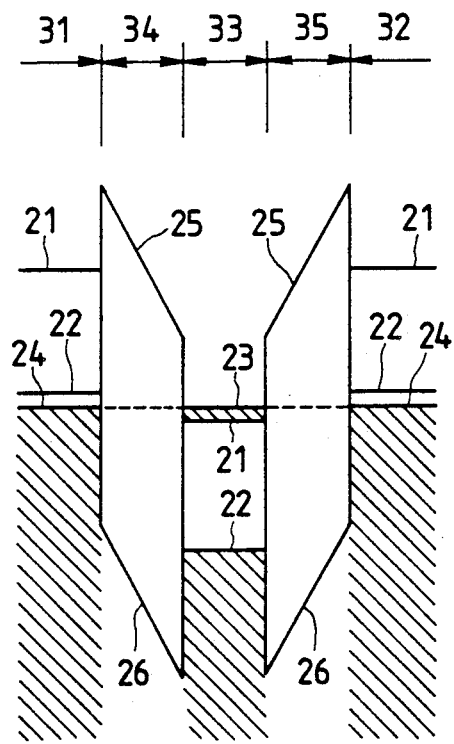
Figure 3B:
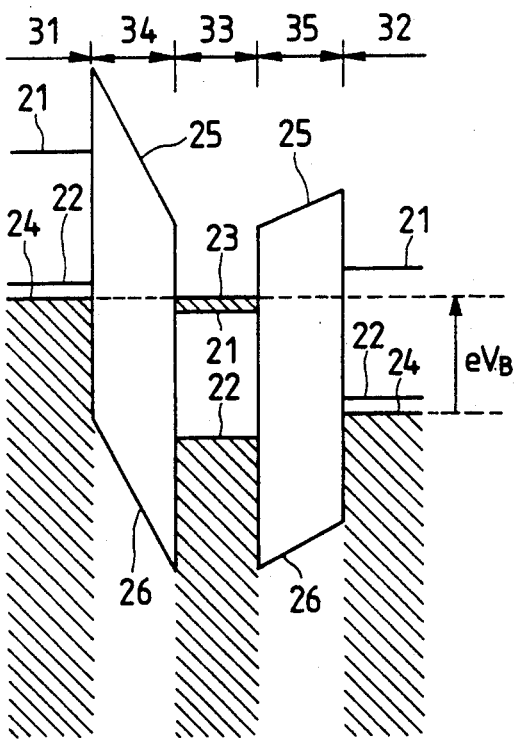
Figure 3C:
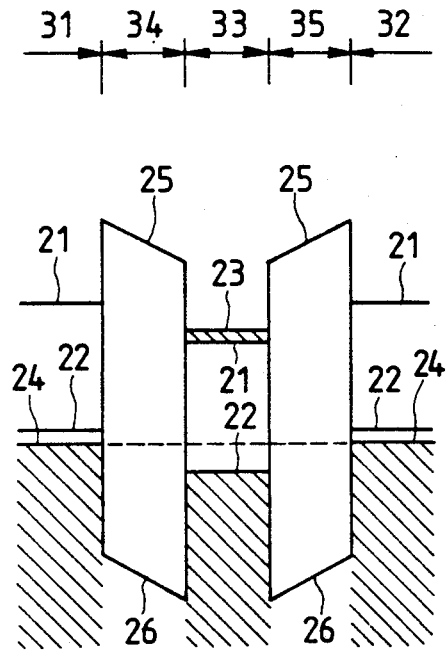
Figure 3D:
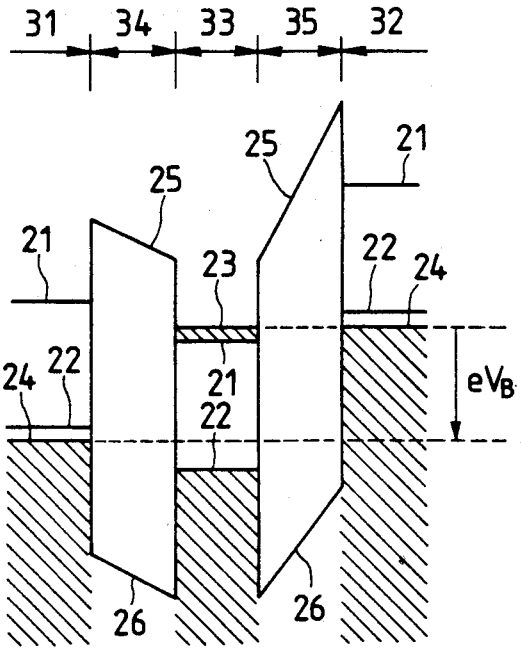

Described here is the case where the capacitor electrodes have the p type of conduction and the electrically conductive thin film formed therebetween has the n type of conduction. It need not be pointed out that these electrodes and the electrically conductive thin film are isolated from each other by an insulator. FIG. 3(a) is a diagram which schematically illustrates the band condition where the bias voltage is 0. Similarly to the case of FIG. 2 hereinafter, a bias voltage is applied to the electrode 32 of the right side with the electrode 31 of the left side as a reference. FIG. 3(b) illustrates the case where a positive bias voltage is applied. What lies between the conductive thin film 33 and the electrode 32 corresponds to that of FIG. 2(d) where the tunnel current is suppressed. On the other hand, what lies between the conductive thin film 33 and the electrode 31 corresponds to that of FIG. 2(a) where the tunnel current flows. As a result, a large potential difference develops between the conductive thin film 33 and the electrode 32, and the condition is established as shown in FIG. 3(b). FIG. 3(c) shows the case where the bias voltage is set to 0 again. In FIG. 3(c), the conductive thin film 33 is negatively charged as a current was poured thereinto under a positive bias as shown in FIG. 3(b), and the condition of FIG. 2(d) is realized; i.e., the electric charge is stored. Then, as a negative bias is applied, a band diagram shown in FIG. 3(d) is obtained by the mechanism same as that of FIG. 3(b). Thereafter, any one of the conditions of FIGS. 3(b), 3(c) and 3(d) is realized depending upon the polarity of the bias voltage.

In this structure, the tunnel current is surely suppressed for the bias of both polarities. However, the capacitance is determined by the resultant thickness of the insulators 34 and 35; i.e., the capacitance decreases greatly. When the insulators 34 and 35 have an equal thickness, the capacitance of this structure is halved compared with the capacitor consisting of electrode 31, insulator 34, and conductive thin film 33, and the advantage of suppressing the tunnel current is offset. The tunnel current decreases abruptly with the increase in the thickness of the insulator. Therefore, the capacitor in which the insulators 34 and 35 are formed as a unitary structure without the conductive thin film 33, permits reduced current to flow for the same bias voltage though the capacitance is the same, and can be more easily fabricated. It was therefore learned that the above-mentioned structure is not practical. Embodiment 1

Figure 4:
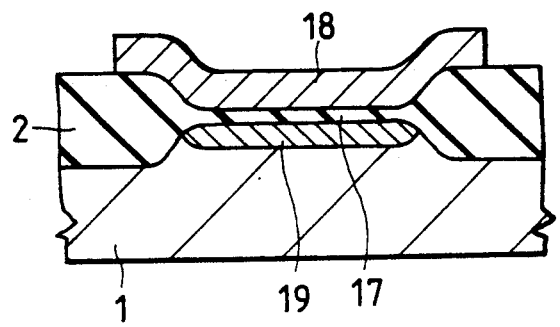
FIGS. 4 and 10 are section views showing different embodiments of the present invention.

A first embodiment of the invention will now be described in conjunction with FIGS. 4 to 7. FIG. 4 is a diagram which schematically shows the cross-sectional structure of this embodiment. An insulator 2 for device isolation is selectively formed on an n-type silicon substrate 1 having a resistivity of 10 ohms.cm. The substrate is opposed to a boron nitride substrate and is heat-treated in a nitrogen atmosphere at a temperature of 900° C. for 30 minutes to diffuse boron into the substrate 1 in order to form a p-type doped region 19 that contains boron at a high concentration. Measurement of resistivity by the four point probe method indicates the concentration on the surface of the doped region 19 to be $1.5 \times 10^{20}$ cm$^{-3}$. Thereafter, the heat treatment is carried out at a temperature of 800° C. for 15 minutes in a nitrogen atmosphere containing 1% of oxygen to thermally oxidize the doped region 19, in order to form a capacitor insulator 17. Then, a polycrystalline silicon film is formed by the well-known low-pressure chemical vapor phase deposition, and phosphorous diffusion is effected at 875° C. for 30 minutes using POCl$_3$ as a source of diffusion to dope the polycrystalline silicon film with phosphorus. Furthermore, unnecessary portions of the polycrystalline silicon film are selectively removed to form a gate electrode 18 composed of the n-type polycrystalline silicon film. Formation of the capacitor is thus completed. The methods described above are all known ones. Measurement of the capacitance of the thus formed capacitor indicates the thickness of the thermally oxidized film to be 2.8 nm. Here, however, the relative dielectric constant of the thermally oxidized film is presumed to be 3.82. The effective area (area of the doped region 19 which is the lower electrode) of the capacitor is 0.46 mm$^2$.

Figure 5:
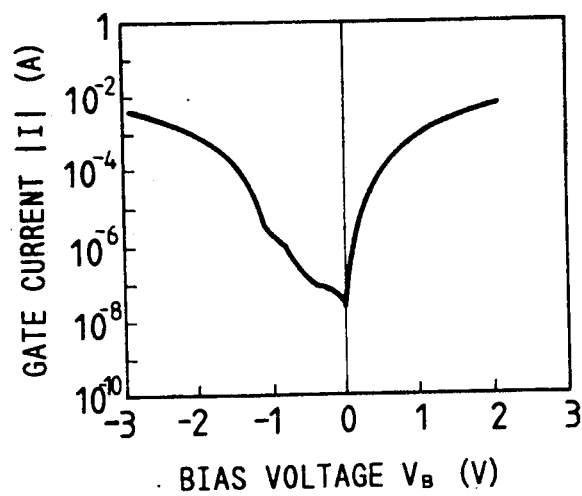
FIGS. 5, 6 and 8 are diagrams showing current/voltage characteristics obtained according to the prevent invention.
Figure 6:
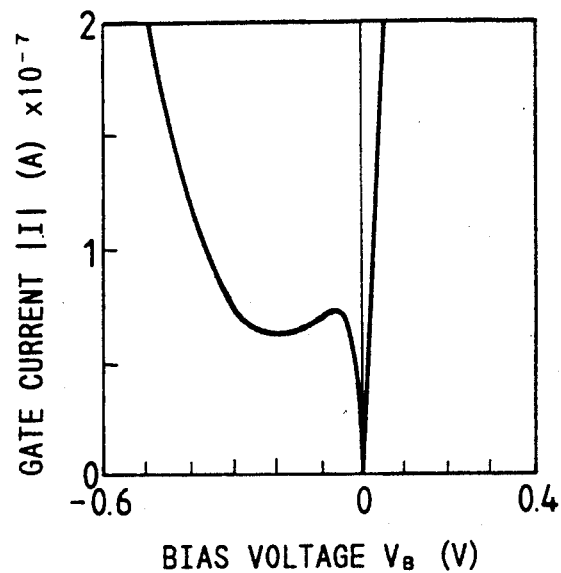

In the capacitor of this embodiment, the gate electrode (upper electrode) 18 has the n type of conduction and the doped region 19 that serves as the lower electrode has the p type of conduction. FIG. 5 shows a relationship between the current (gate current) that flows through the thus formed capacitor and the bias voltage that is applied. Here, the voltage applied to the gate electrode 18 serves as a bias voltage with the doped region 19 as a reference. As will be understood from FIG. 5, the gate current is greatly decreased relative to the negative bias voltage, exhibiting the effects of the present invention. The same effects are exhibited strikingly when the bias voltage is smaller than 1.2 V (corresponds to the forbidden band width of silicon) as can be expected from FIG. 2. FIG. 6 shows current-voltage characteristics in which the results of FIG. 5 are shown being converted into a linear scale, the x-axis being enlarged into a region of from $-0.6$ V to $+0.4$ V and the y-axis being enlarged into a region of from 0 to $2 \times 10^{-7}$ A. FIG. 6 clearly indicates the presence of negative resistance specific to the tunnel current.

According to the present invention, the capacitor electrodes are constituted by a pair which includes p-type semiconductor and an n-type semiconductor. Therefore, the object of the present invention can be accomplished even when materials and manufacturing methods different from those of the above-mentioned embodiment are used provided the same structure is realized. For example, a polycrystalline silicon film or an amorphous silicon film may be formed on the silicon substrate 1 instead of forming the doped region 19 of the above-mentioned embodiment, and the ion implantation may be employed instead of the diffusion method in doping the impurities. At the time of forming the polycrystalline silicon film or the amorphous silicon film, furthermore, it is also allowable to dope the impurities at the same time. It needs not be pointed out that the present invention can be realized even by using any other dopants as impurities such as arsenic and antimony instead of phosphorus, and by using any other semiconductor such as GaAs or the like in addition to silicon.

Figure 7:
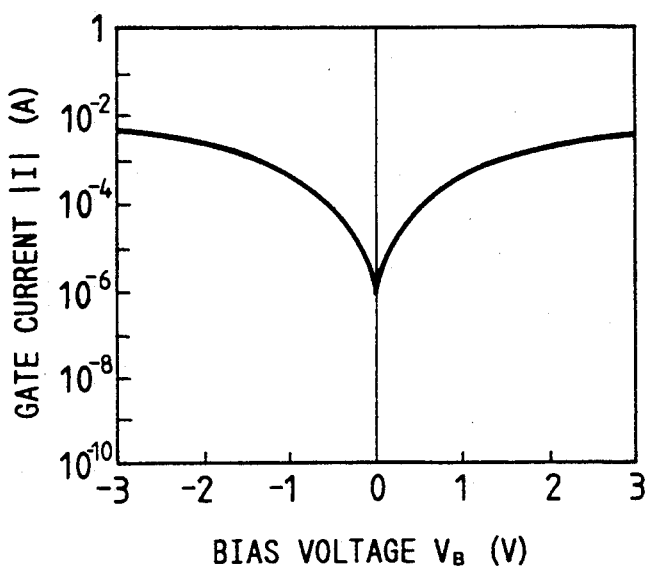

FIG. 7 shows the results of a comparative example to demonstrate the effects of the present invention. In the comparative example, boron is doped by the above-mentioned method of opposing the boron nitride substrate instead of diffusing phosphorus into the polycrystalline silicon electrode 18 that is shown in FIG. 4. Therefore, both the gate electrode 18 and the doped electrode 19 are of the p type. In this capacitor as will be obvious from FIG. 7, even when a negative bias voltage is applied, the gate current flows to such a degree that is as great as when a positive bias voltage is applied. Distinguished effects from the upper and lower electrodes of dissimilar conduction types of the capacitor will be obvious from the comparison of FIG. 5 with FIG. 7. Embodiment 2

Figure 8:
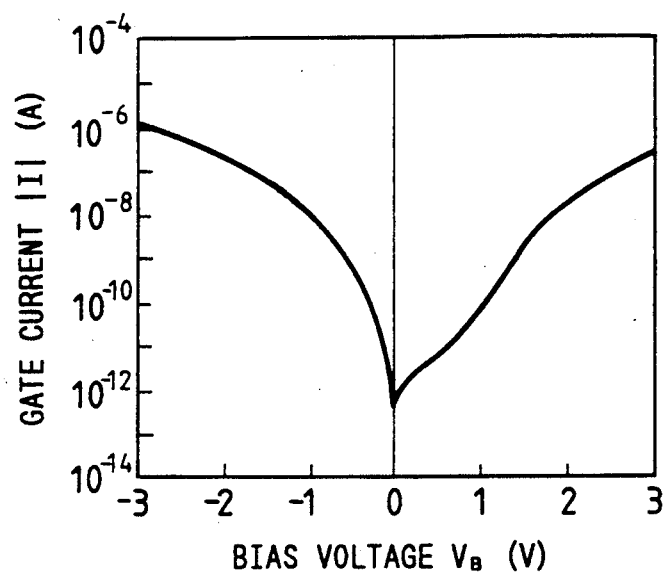

FIG. 8 shows current-voltage characteristics of the capacitor according to a second embodiment of the present invention. In this capacitor, the n-type doped region 19 is formed by using the p-type silicon substrate 1 and using POCl$_3$ as a diffusion source under the same conditions as those mentioned above. The doping for the polycrystalline silicon film that constitutes the gate electrode 18 is effected by the aforementioned method of opposing the boron nitride substrate so that it possesses the p type conduction. In other respects, quite the same methods and conditions are employed as those of the first embodiment to complete the capacitor. Measurement of capacitance indicates the thickness of the capacitor insulator to be 5.3 nm. The insulator has a thickness different from that of the first embodiment probably due to the formation of an oxide film having a thickness greater than that of the first embodiment that stems from the enhanced oxidation caused by phosphorous heavily doped in the substrate. In this embodiment, the gate current decreases for the positive bias voltage. This is because the gate electrode 18 is of the p type and the doped region 19 is of the n type contrary to the case of the first embodiment.

Figure 9:
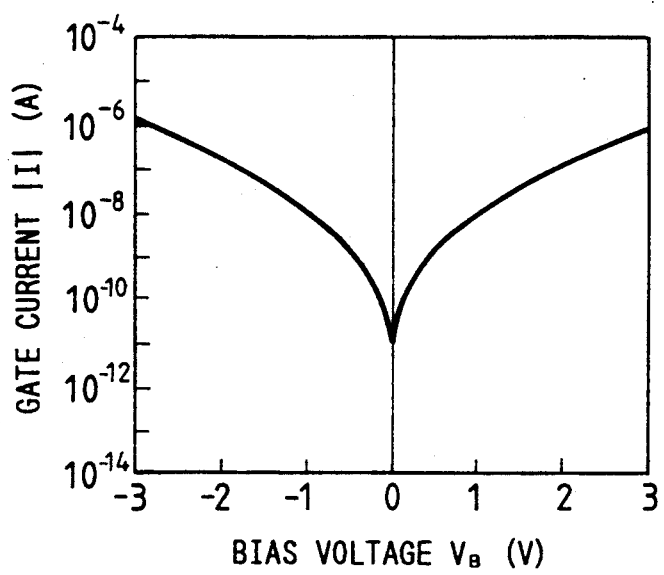
FIGS. 7 and 9 are diagrams showing current/voltage characteristics of conventional capacitors.

FIG. 9 shows the results of a comparative example to demonstrate the effects of this embodiment. In FIG. 9, the doping for the gate electrode 18 is effected by diffusing phosphorus instead of the method of opposing the boron nitride substrate, and both the gate electrode 18 and the doped region 19 are of the n type. In the capacitor in which the two electrodes have the same type of conduction as is obvious from FIG. 9, a large gate current flows even for a positive bias voltage just like for a negative bias voltage It is therefore confirmed that the two electrodes having different types of conduction are effective for achieving the object. Embodiment 3

Figure 10:
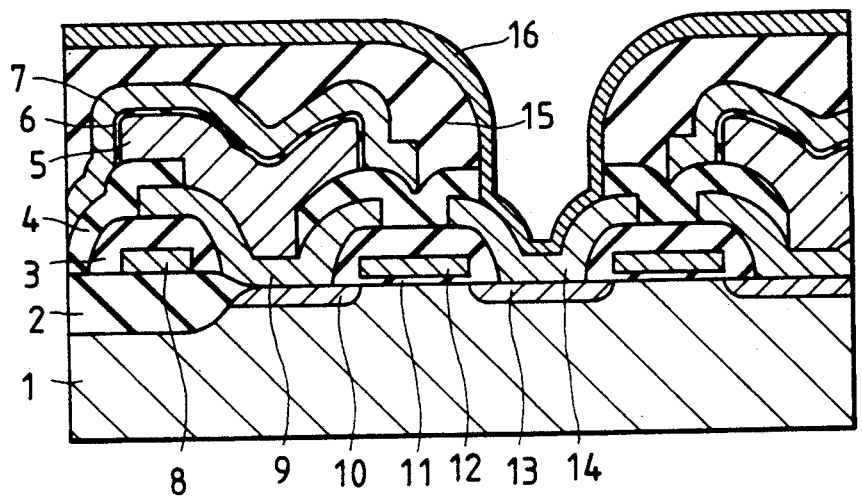

A third embodiment will now be described with reference to FIG. 10 which is a diagram showing in cross section the structure of a DRAM provided with a stacked capacitor according to the present invention.

The method of fabrication will be described below. An insulator 2 for device isolation is selectively formed by the LOCOS method on a p-type single crystalline silicon substrate 1 having a resistivity of 10 ohms.cm. Then, a gate insulator 11 is formed by the thermal oxidation method maintaining a thickness of 15 nm. Thereafter, a polycrystalline silicon film is formed by the low-pressure chemical vapor phase deposition, phosphorus is diffused (at 875° C. for 30 minutes) using $POCl_3$ as a diffusion source, and the polycrystalline silicon film is selectively removed to form a gate electrode 12 and a word line 8. Using the gate electrode 12 as a mask, arsenic ions are implanted and the heat treatment is effected in an nitrogen atmosphere at a temperature of 950° C. for 10 minutes to form doped regions 10 and 13 in a self-aligned manner relative to the gate electrode 12. A silicon dioxide film 3 is then formed by the low-pressure chemical vapor phase deposition, portions corresponding to connection holes are selectively removed, and polycrystalline silicon pads 9 and 14 are formed by the same method as the one for forming the gate electrode 12. A silicon oxide film 4 is formed by the low-pressure chemical vapor phase deposition, portions corresponding to connection holes are selective removed, and a polycrystalline silicon electrode 5 is formed in the same manner as the formation of the gate electrode 12. Thereafter, a capacitor insulator 6 is formed in a manner that will be described below and a polycrystalline silicon electrode 7 is formed by a method similar to the one for forming the gate electrode 12. Instead of diffusing phosphorus, however, impurities are introduced into the polycrystalline silicon electrode 7 by opposing the silicon substrate 1 on which the polycrystalline silicon film is formed to a boron nitride substrate and effecting the heat treatment in a nitrogen atmosphere at 900° C. for 30 minutes. Therefore, boron is introduced in large amounts into the polycrystalline silicon film and whereby the p-type of conduction is obtained. Thereafter, the widely known wiring step is effected to form an interlayer insulator 15 and a bit line 16 to complete a dynamic random access memory (DRAM).

In the DRAM, the capacitor is constituted by the first polycrystalline silicon electrode 5 formed on the silicon substrate 1, the capacitor insulator 6 and the second polycrystalline silicon electrode 7. The first polycrystalline silicon electrode 5 is connected to the first doped region 10 via polycrystalline silicon pad 9. Upon application of a voltage to the gate electrode 12, the doped region 10 is electrically connected to the second doped region 13 and is further connected to the bit line 16 via polycrystalline silicon pad 14. In this embodiment, the polycrystalline silicon electrode 7 formed on the insulator 6 is of the p-type, and the other polycrystalline silicon electrode 5, pad 9 and doped region 10 are all of the n-type. This makes the most important point in the present invention.

In this embodiment, an n-channel MOSFET in which the doped region 10 serves as a source and the doped region 13 serves as a drain is connected as a switching transistor to the capacitor. It is of course allowable to use a p-channel MOSFET as the switching transistor. In this case, however, the operation speed becomes slower than that of when the n-channel MOSFET is used. When the p-channel MOSFET is used, the first polycrystalline silicon electrode 5 of the capacitor connected to the doped region 10 that is a source is of the p type, and the second polycrystalline silicon electrode 7 is of the n-type.

The capacitor insulator 6 is formed in a manner as described below. After the polycrystalline silicon electrode 5 is formed, the heat treatment is effected at 900° C. in an $NH_3$ atmosphere of 1 atm. for 30 minutes to form a thin thermal nitride film. A silicon nitride film is then formed maintaining a thickness of 3 nm by the low-pressure chemical vapor phase deposition, and the surface of the silicon nitride film is oxidized at 900° C. in a steam atmosphere to form a silicon oxide film thereby to complete the formation of the capacitor insulator. Measurement of capacitance indicates the thickness of the insulator to be 5 nm in terms of silicon dioxide equivalent. With the capacitor insulator being formed as described above, various problems associated with the case of a single thermally oxidized film are solved, i.e., variation of the film thickness is suppressed that is caused by enhanced oxidation due to phosphorus in the polycrystalline silicon film, and degradation of the film quality is avoided that is caused by phosphorus introduced in the oxide film during oxidation. Thus, the effects of the present invention can be exhibited more efficiently. The inventors have further studied capacitors in which the silicon nitride film and the silicon dioxide film have different thicknesses as well as those that have a $Ta_2O_5$ film, an $Al_2O_3$ film or a stack of these films, and have found the fact that the present invention is particularly effective for the insulators having a thickness of smaller than 6 nm in terms of silicon dioxide equivalent. The thickness of the insulator in terms of silicon dioxide equivalent should preferably be greater than 2 nm. When the thickness is smaller than 2 nm, the insulator allows a large leakage current.

In this embodiment, a voltage applied to the second capacitor electrode 7 is set to be higher than an ordinarily employed voltage of 0.5 Vcc. Here, the voltage Vcc is the one which is higher than the other voltage that are applied to the bit lines 16 when the capacitor is to be electrically charged. The lower voltage is in many cases 0 V. Therefore, when the voltage of 0 V or Vcc (>0) is applied to the first polycrystalline silicon electrode 5 to store the charge in the capacitor, the absolute value of negative voltage applied to the capacitor insulator 6 becomes smaller than that of the ordinary 0.5 Vcc system (in which the voltage 0.5 Vcc is applied to the capacitor electrode 7), and the positive voltage increases on the other hand. Here, the voltage applied to the capacitor insulator 6 is determined with the first polycrystalline silicon electrode 5 as a reference. In the structure and the system of this embodiment, the gate current is suppressed for the positive voltage applied to the capacitor insulator 6 just like in the aforementioned second embodiment, although the voltage is larger than the one in the prior art. Therefore, despite the thickness of the insulator being decreased compared with that of the prior art, the gate current does not increase for both polarities and the electric charge are kept stored. When the capacitor has the same area, therefore, the capacitance can be increased. When the capacitance is set to be the same, furthermore, the capacitor area can be reduced making it possible to accomplish a high degree of integration. As required, furthermore, a voltage Vcc, 0.5 Vcc may be applied to the second polycrystalline silicon electrode 7.

In this embodiment, the annealing is effected at 400° C. in an atmosphere containing hydrogen for 30 minutes after the capacitor has been formed in order to efficiently decrease the gate current.

In the DRAM of this embodiment, furthermore, the temperature of the silicon substrate 1 becomes higher than 50° C. and reaches, for example, about 70° C. in an ordinary room atmosphere due to the heat generated when the circuit is in operation, and reaches about 120° C. in an atmosphere of 70° C. The circuit operation, however, does not become abnormal that may be caused by an increase in the current that flows through the capacitor insulator. This is because in the structure of the present invention, the current increases little with the increase in temperature unlike the case of the tunnel diode.

According to the present invention as described above, the thickness of the capacitor insulator can be decreased without permitting the current that flows through the capacitor insulator to increase. When the capacitor area is set to be the same, therefore, the capacitance can be increased. When the capacitance is the same, furthermore, the capacitor area can be decreased compared with that of the conventional art.

What is claimed is:

1. A capacitor comprising a first electrode; an insulator formed on said first electrode; and a second electrode formed on said insulator,
   wherein first and second semiconductor layers of p-type and n-type conductivity, respectively, are formed on the surface regions of said first and second electrodes at least on sides thereof adjacent to said insulator, said first and second semiconductor layers having an impurity doped concentration of $1 \times 10^{19}$ cm$^{-3}$ to $2 \times 10^{21}$ cm$^{-3}$,
   wherein said insulator has a thickness of 2nm to 6nm in terms of a silicon dioxide equivalent and is disposed such that a pn junction is not effected between said first and second electrodes, and
   wherein said first electrode is to be applied with a relatively positive bias voltage with respect to a reference at said second electrode.

2. A capacitor according to claim 1, wherein said semiconductor layers are composed of polycrystalline silicon.

3. A capacitor according to claim 1, wherein said first and second electrodes are vertically formed with said insulator being interposed therebetween, said first electrode is disposed beneath said second electrode and is also an impurity-doped region formed in an upper main surface region of a silicon substrate.

4. A capacitor according to claim 1, wherein said first and second electrodes are vertically formed with said insulator being disposed therebetween, said first electrode is disposed beneath said second electrode and is composed of a polycrystalline silicon film.

5. A capacitor according to claim 4, wherein said first electrode is electrically connected to an impurity-doped region, forming said first semiconductor layer, of a p-type conductivity that is formed in the surface region of said semiconductor substrate.

6. A semiconductor device comprising a capacitor formed on a semiconductor substrate to store data; and a MOS transistor for driving said capacitor,
   wherein said capacitor has a first electrode of one of a heavily doped p-type and n-type conductivity, electrically coupled to one of a source and drain of said MOS transistor, a second electrode of the other of said heavily doped p-type and n-type conductivity, and has a thin insulator interposed between said first electrode and said second electrode,
   wherein said insulator has a thickness of 2nm to 6nm in terms of a silicon dioxide equivalent and is disposed such that a pn junction is not effected between said first and second electrodes, and
   wherein said first electrode corresponds to a storage node capacitance electrode and said second electrode is to be biased at a reference potential.

7. A semiconductor device according to claim 6, wherein said first and second electrodes are composed of silicon.

8. A semiconductor device according to claim 7, wherein said first and second electrodes are formed in a vertically stacked arrangement with said insulator being interposed therebetween, said first electrode is disposed beneath said second electrode and is also an impurity-doped region formed above an upper main surface region of said semiconductor substrate.

9. A semiconductor device according to claim 6, wherein said first and second electrodes are composed of polycrysatlline silicon films.

10. A semiconductor device according to claim 9, wherein said first and second electrodes have impurity concentrations of $1 \times 10^{19}$ cm$^{-3}$ to $2 \times 10^{21}$ cm$^{-3}$ at least on portions along sides thereof adjacent to said insulator.

11. A semiconductor device according to claim 9, wherein said capacitor is arranged on or over at least the gate of said MOS transistor, and said first electrode is electrically coupled to the source of said MOS transistor.

12. A capacitor according to claim 1, wherein at least said second of said semiconductor layers is comprised of polycrystalline silicon.

13. A semiconductor device according to claim 10, wherein said capacitor is arranged over at least a portion of the gate of said MOS transistor, and said first electrode is electrically coupled to the source of said MOS transistor.

14. A semiconductor device according to claim 13, wherein said first and second electrodes are of an n-type and p-type conductivity, respectively.

15. A semiconductor device according to claim 8, wherein said first and second electrodes are composed of polycrystalline silicon films.

16. A semiconductor device according to claim 15, wherein said capacitor is arranged over at least a portion of the gate of said MOS transistor, and said first electrode is electrically coupled to the source of said MOS transistor.

17. A semiconductor device according to claim 16, wherein said first and second electrodes are of an n-type and p-type conductivity, respectively.

18. A capacitor comprising a first electrode formed in an upper surface region of a silicon substrate; an insulator formed on said first electrode; and a second electrode formed on said insulator, wherein said first electrode and said second electrode include surface regions on sides thereof adjacent to said insulator of p-type and n-type conductivity, respectively, each surface region having an impurity-doping concentration of $1 \times 10^{19}$ cm$^{-3}$ to $2 \times 10^{21}$ cm$^{-3}$, said second electrode including a polycrystalline silicon film, wherein said insulator has a thickness of not greater than 6nm in terms of a silicon dioxide equivalent and is disposed such that a pn junction is not effected either directly or indirectly between said first and second electrodes, and wherein said first electrode is to be applied with a relatively positive bias voltage with respect to a reference at said second electrode.

19. A capacitor according to claim 18, wherein said insulator has a thickness of 2nm to 6nm in terms of a silicon dioxide equivalent.

20. A semiconductor device according to claim 18, wherein said positive bias voltage is less than 1.2 volts.

21. A semiconductor device according to claim 1, wherein said positive bias voltage is less than 1.2 volts.

22. A semiconductor device comprising a data storage capacitor formed on a semiconductor substrate; and a MOS transistor for driving said capacitor, wherein said capacitor has a first electrode of one of a p-type and n-type conductivity, electrically coupled to the source of said MOS transistor, a second electrode of the other of said p-type and n-type conductivity, and has an insulator interposed therebetween, wherein said insulator has a thickness of not greater than 6nm in terms of a silicon dioxide equivalent and is disposed such that a pn junction is not effected, either directly or indirectly, between said first and second electrodes, wherein said first and second electrodes have impurity concentrations of $1 \times 10^{19}$ cm$^{-3}$ to $2 \times 10^{21}$ cm$^{-3}$ at least on portions along sides thereof adjacent to said insulator, and wherein said first electrode corresponds to a storage node capacitance electrode and said second electrode is to be biased at a reference potential.

23. A capacitor according to claim 22, wherein said insulator has a thickness of 2nm to 6nm in terms of a silicon dioxide equivalent.

* * * * *